(12) United States Patent
Takabe (10) Patent No.: US 11,813,867 B2
(45) Date of Patent: Nov. 14, 2023

(54) LIQUID EJECTING HEAD AND RECORDING APPARATUS

(71) Applicant: SEIKO EPSON CORPORATION, Tokyo (JP)

(72) Inventor: Motoki Takabe, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 17/646,898

(22) Filed: Jan. 4, 2022

(65) Prior Publication Data

US 2022/0212470 A1 Jul. 7, 2022

(30) Foreign Application Priority Data

Jan. 7, 2021 (JP) ................................. 2021-001309

(51) Int. Cl.
*B41J 2/14* (2006.01)
*H10N 30/80* (2023.01)

(52) U.S. Cl.
CPC ........ *B41J 2/14233* (2013.01); *H10N 30/802* (2023.02); *B41J 2002/14491* (2013.01); *B41J 2202/19* (2013.01)

(58) Field of Classification Search
None
See application file for complete search history.

(56) References Cited

U.S. PATENT DOCUMENTS

| | | | |
|---|---|---|---|
| 2014/0240398 A1* | 8/2014 | Yamashita | B41J 2/161 347/40 |
| 2014/0271447 A1* | 9/2014 | Miwa | H01L 41/43 423/598 |
| 2014/0292949 A1 | 10/2014 | Yazaki | |
| 2016/0271944 A1* | 9/2016 | Matsuo | B41J 2/161 |
| 2018/0086069 A1* | 3/2018 | Kakiuchi | B41J 2/14233 |

FOREIGN PATENT DOCUMENTS

| | | |
|---|---|---|
| JP | 2007-062036 A | 3/2007 |
| JP | 2009-269315 A | 11/2009 |
| JP | 2014-188717 A | 10/2014 |

* cited by examiner

*Primary Examiner* — Erica S Lin
(74) *Attorney, Agent, or Firm* — WORKMAN NYDEGGER (57) ABSTRACT

A liquid ejecting head includes a pressure compartment forming substrate, a piezoelectric actuator, a sealing plate, and a flexible wiring board. A pressure compartment is formed in the pressure compartment forming substrate. The piezoelectric actuator is disposed over the pressure compartment. The sealing plate has an opening going from a first surface, which is farther from the pressure compartment, to a second surface, which is closer to the pressure compartment. The sealing plate is configured to cover the piezoelectric actuator located in a first direction with respect to the opening. The flexible wiring board is inserted in the opening and is electrically coupled to the piezoelectric actuator. A first opening width of the opening at the first surface in the first direction is greater than a second opening width of the opening at the second surface in the first direction.

17 Claims, 10 Drawing Sheets

LIQUID EJECTING HEAD AND RECORDING APPARATUS

The present application is based on, and claims priority from JP Application Serial Number 2021-001309, filed Jan. 7, 2021, the disclosure of which is hereby incorporated by reference herein in its entirety.

BACKGROUND

1. Technical Field

Embodiments of the present disclosure relate to a liquid ejecting head and a recording apparatus.

2. Related Art

Some liquid ejecting heads according to related art are configured to eject liquid contained inside pressure compartments from nozzles by causing piezoelectric elements to vibrate a diaphragm disposed over the pressure compartments as disclosed in, for example, JP-A-2014-188717, JP-A-2007-062036, and JP-A-2009-269315. The liquid ejecting head includes a sealing plate that seals the piezoelectric elements. The sealing plate has an opening. Lead electrodes connected from the piezoelectric elements extend in one direction and are electrically coupled to a flexible wiring board inside the opening. Drive signals for driving the piezoelectric elements are communicated to the piezoelectric elements via the flexible wiring board and the lead electrodes.

In the process of connecting the flexible wiring board to the lead electrodes, a tool for mounting is inserted into the opening of the sealing plate. The tool applies heat to an adhesive inside the opening so that the adhesive will cure. The flexible wiring board becomes mounted to the lead electrodes due to the curing of the adhesive. The following problem might occur in related art: the tool might collide with a wall surface of the opening in the process of inserting the tool into the opening, and, if such a collision occurs, it is difficult to mount the flexible wiring board onto the lead electrodes with high precision.

SUMMARY

A liquid ejecting head according to a certain aspect of the present disclosure includes a pressure compartment forming substrate, a piezoelectric actuator, a sealing plate, and a flexible wiring board. A pressure compartment is formed in the pressure compartment forming substrate. The piezoelectric actuator is disposed over the pressure compartment. The sealing plate has an opening going from a first surface, which is farther from the pressure compartment, to a second surface, which is closer to the pressure compartment. The sealing plate is configured to cover the piezoelectric actuator located in a first direction with respect to the opening. The flexible wiring board is inserted in the opening and is electrically coupled to the piezoelectric actuator. A first opening width of the opening at the first surface in the first direction is greater than a second opening width of the opening at the second surface in the first direction.

A recording apparatus according to a certain aspect of the present disclosure includes the above liquid ejecting head.

DESCRIPTION OF EXEMPLARY EMBODIMENTS

With reference to the accompanying drawings, an exemplary embodiment of the present disclosure will now be explained. In the drawings, the dimensions and scales of components may be made different from those in actual implementation. Since the embodiment described below shows some preferred examples of the present disclosure, they contain various technically-preferred limitations. However, the scope of the present disclosure shall not be construed to be limited to the examples described below unless and except where any intention of restriction is mentioned explicitly.

In the description below, three directions that are orthogonal to one another will be referred to as X-axis direction, Y-axis direction, and Z-axis direction. The X-axis direction includes X1 direction and X2 direction, which are the opposite of each other. The X-axis direction is an example of a first direction. The Y-axis direction includes Y1 direction and Y2 direction, which are the opposite of each other. The Y-axis direction is an example of a second direction. The Z-axis direction includes Z1 direction and Z2 direction, which are the opposite of each other. The Z1 direction is the direction going down. The Z2 direction is the direction going up. In this specification, the terms "upper" and "lower" will be used. The terms "upper" and "lower" as used herein correspond to the ordinary meaning of "upper" and "lower" in a normal state of use, in which nozzles are directed vertically downward, of a liquid ejecting apparatus 1.

The X-axis direction, the Y-axis direction, and the Z-axis direction are orthogonal to one another. In an ordinary configuration, the Z-axis direction is along the vertical direction. However, the Z-axis direction is not necessarily along the vertical direction.

Figure 1:
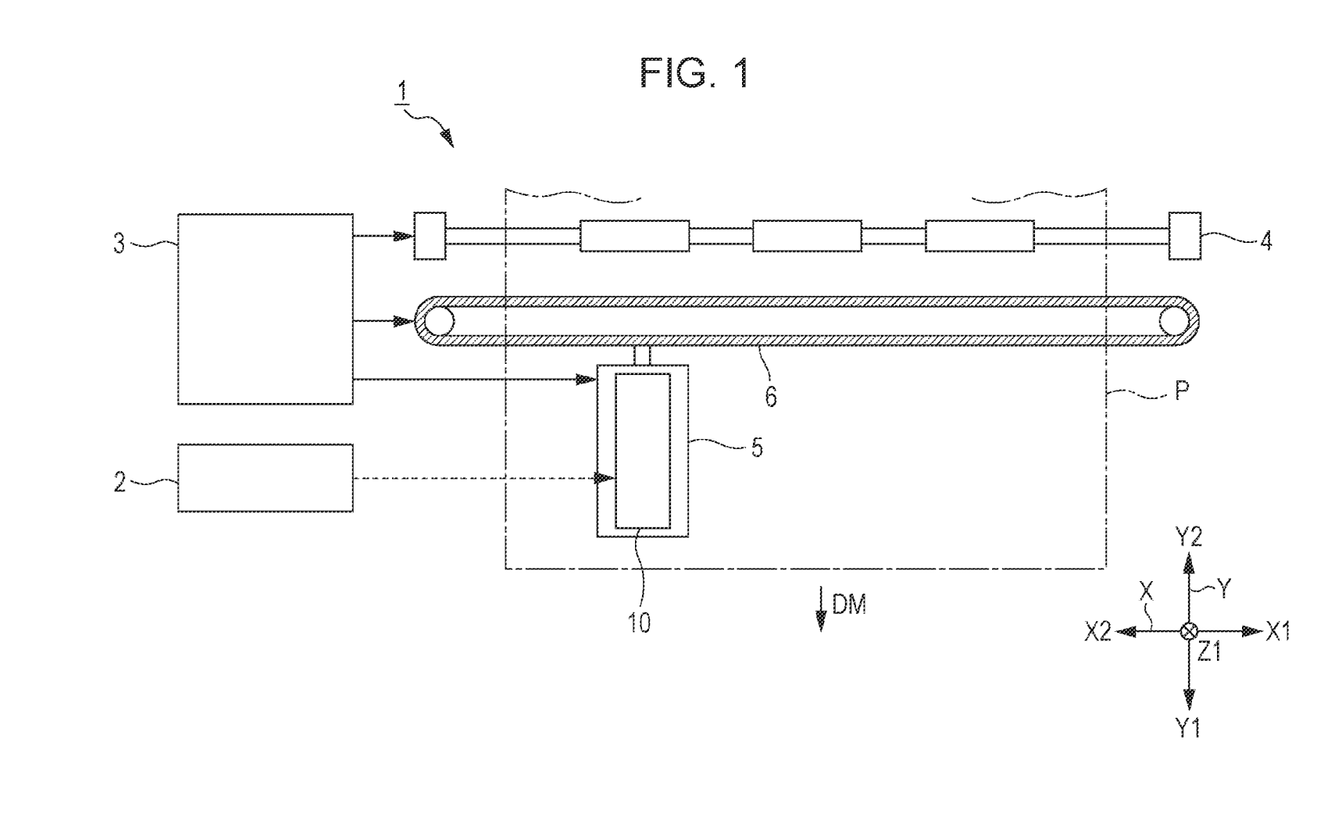
FIG. 1 is a schematic diagram that illustrates, partially by blocks, an example of the configuration of a liquid ejecting apparatus according to a first embodiment.

FIG. 1 is a schematic diagram that illustrates an example of the configuration of a liquid ejecting apparatus 1 according to a first embodiment. The liquid ejecting apparatus 1 is an ink-jet-type printing apparatus that ejects droplets of ink, which is an example of "liquid", onto a medium P. The liquid ejecting apparatus 1 according to the present embodiment is a head-scan-type printing apparatus also called as a serial-type printer that reciprocates a plurality of nozzles, from which ink is ejected, in the direction of the width of the medium P. The medium P is, typically, printing paper such as plain paper, coated paper, glossy paper, etc. The medium P is not limited to printing paper. The medium P may be a print target made of any material such as, for example, a resin film or a cloth. The liquid ejecting apparatus 1 is an example of a recording apparatus.

As illustrated in FIG. 1, the liquid ejecting apparatus 1 includes a liquid container 2 that contains ink. Some specific examples of the liquid container 2 are: a cartridge that can be detachably attached to the liquid ejecting apparatus 1, a bag-type ink pack made of a flexible film material, an ink tank which can be refilled with ink, etc. Any type of ink may be contained in the liquid container 2. The liquid container 2 is an example of a liquid containing unit.

In an ordinary configuration, the liquid container 2 includes a first liquid container and a second liquid container, though not illustrated. The liquid container 2 may be a single liquid container instead. The first liquid container contains first ink. The second liquid container contains second ink, the type of which is different from the type of the first ink. For example, the color of the first ink and the color of the second ink are different from each other. The first ink and the second ink may be the same type of ink.

The liquid ejecting apparatus 1 includes a control unit 3, a medium transportation mechanism 4, a carriage 5, a carriage transportation mechanism 6, and a plurality of liquid ejecting heads 10. The control unit 3 controls the operation of each component of the liquid ejecting apparatus 1. The control unit 3 includes a processing circuit, for example, a CPU (central processing unit) or an FPGA (field programmable gate array), and a storage circuit such as a semiconductor memory. Various kinds of program and data are stored in the storage circuit. The processing circuit realizes various kinds of control by running the program and using the data.

The medium transportation mechanism 4 is controlled by the control unit 3 and transports the medium P in a transportation direction DM. The transportation direction DM is, for example, the Y1 direction. The transportation direction DM is not limited to the Y1 direction. The transportation direction DM may be the Y2 direction or any other direction. The medium transportation mechanism 4 includes a transportation roller that is elongated in the X-axis direction and a motor that causes the transportation roller to rotate. The configuration of the medium transportation mechanism 4 is not limited to the illustrated example in which the transportation roller is used. For example, a drum that transports the medium P in a state in which the medium P is attracted to the circumferential surface of the drum due to an electrostatic force, etc., or an endless belt, may be used instead.

The plurality of liquid ejecting heads 10 is mounted on the carriage 5. The carriage transportation mechanism 6 is controlled by the control unit 3 and reciprocates the carriage 5 in the X-axis direction. The carriage transportation mechanism 6 includes, for example, an endless belt tensioned around and between plural rollers distanced from each other in the X-axis direction.

Ink flows from the liquid container 2 through an ink flow passage and is then supplied to the liquid ejecting head 10. The liquid ejecting head 10 is controlled by the control unit 3 and ejects ink from each of the plurality of nozzles toward the medium P.

Figure 2:
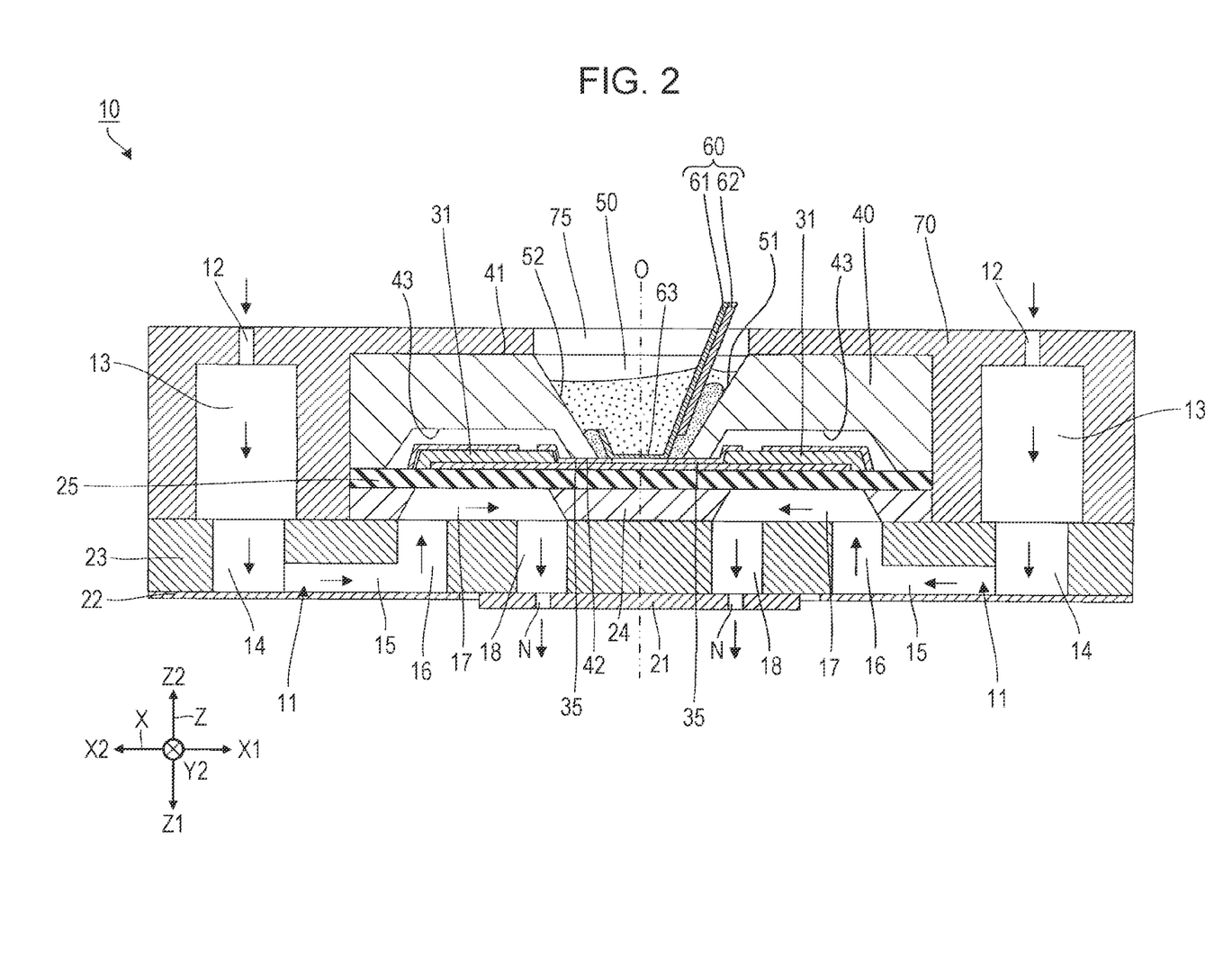
FIG. 2 is a cross-sectional view of a liquid ejecting head taken along an X-Z plane.

Next, with reference to FIG. 2, ink flow passages 11 formed inside the liquid ejecting head 10 will now be explained. FIG. 2 is a cross-sectional view of the liquid ejecting head 10 taken along an X-Z plane. The X-Z plane is a plane that is along the X-axis direction and the Z-axis direction. In FIG. 2, the direction in which ink flows inside the liquid ejecting head 10 is indicated by arrows. Flow passages 11 through which ink flows are formed inside the liquid ejecting head 10. The flow passage 11 leads from a supply inlet 12 to a nozzle N. The flow passages 11 are line-symmetric with respect to a center line O extending in the Z-axis direction.

The flow passage 11 includes the supply inlet 12, a common reservoir 13, a common reservoir 14, a relay flow passage 15, a relay flow passage 16, a pressure compartment 17, a communication flow passage 18, and the nozzle N. The supply inlet 12 is provided on both sides in the X-axis direction of the liquid ejecting head 10. The supply inlet 12 is in communication with the common reservoir 13 in the Z-axis direction. The common reservoir 13 is in communication with the common reservoir 14 in the Z-axis direction. The common reservoirs 13 and 14 are formed in different members respectively. The common reservoir 13, 14 extends in the Y-axis direction. The common reservoir 13, 14 is a common space that is in communication with the plurality of pressure compartments 17. The plural pressure compartments 17 are arranged next to one another in the Y-axis direction.

A plurality of relay flow passages 15, 16 is connected to the common reservoir 14. The plurality of relay flow passages 15, 16 is provided such that they correspond to the plurality of pressure compartments 17 respectively. The plural relay flow passages 15 are arranged next to one another in the Y-axis direction. The relay flow passage 15 extends from the outside toward the inside in the X-axis direction. The relay flow passage 16 is connected to the downstream end of the relay flow passage 15. The relay flow passage 16 extends in the Z2 direction from the relay flow passage 15 and is in communication with the pressure compartment 17.

Each of the plurality of pressure compartments 17 extends inward in the X-axis direction. The communication flow passage 18 is connected to the downstream end of the pressure compartment 17 and extends in the Z1 direction. The plurality of communication flow passages 18 is connected to the plurality of pressure compartments 17 respectively. The plurality of communication flow passages 18 is connected to the plurality of nozzles N respectively.

The communication flow passage 18 is located downstream of the pressure compartment 17. The communication flow passage 18 is located at an inner side in the X-axis direction in comparison with the relay flow passage 16. The communication flow passage 18 provides communication between the pressure compartment 17 and the nozzle N. The communication flow passage 18 extends in the Z-axis direction.

Next, the flow of ink inside the liquid ejecting head 10 will now be explained. Ink flows into the liquid ejecting head 10 through the supply inlet 12. The ink having passed through the supply inlet 12 flows into the common reservoir 13 and next into the common reservoir 14. The flow path of the ink from the common reservoir 14 branches into the plurality of relay flow passages 15. The ink in the relay flow passage 15 flows through the relay flow passage 16 into the pressure compartment 17. The pressure of the ink in the pressure compartment 17 is raised by a piezoelectric actuator 31, which will be described later. Due to the rise in pressure, the ink in the pressure compartment 17 flows through the communication flow passage 18 to be ejected from the nozzle N.

Next, the structure of the liquid ejecting head 10 will now be explained. The liquid ejecting head 10 includes a nozzle plate 21, a bottom plate 22, a flow passage forming substrate 23, a pressure compartment forming substrate 24, a diaphragm 25, and the piezoelectric actuators 31. The liquid ejecting head 10 further includes a sealing plate 40 for sealing the piezoelectric actuators 31, a COF 60 coupled to the piezoelectric actuators 31 electrically, and a cover 70 enclosing the sealing plate 40. COF is an acronym for Chip On Film.

The supply inlet 12 and the common reservoir 13 are formed in the cover 70. A cavity for accommodating the pressure compartment forming substrate 24, the diaphragm 25, the piezoelectric actuators 31, and the sealing plate 40 is formed in the cover 70. The cover 70 encloses the sealing plate 40 from the Z2-directional side. The common reservoir 13 is located on both sides outside the sealing plate 40 in the X-axis direction. The cover 70 has an opening 75 at a position corresponding to the opening 50 of the sealing plate 40.

The nozzle plate 21 has the plurality of nozzles N. The nozzle N is a through hole going in a plate-thickness direction. The plate-thickness direction of the nozzle plate 21 is along the Z axis. The nozzles N constitute each nozzle row, that is, a row of nozzles arranged linearly in the Y-axis direction. Plural nozzle rows distanced from each other in the X-axis direction are formed in the nozzle plate 21. The nozzle plate 21 is bonded to the bottom surface of the flow passage forming substrate 23 and covers the communication flow passages 18 from below. The nozzles N are located at respective positions corresponding to the communication flow passages 18.

The bottom plate 22 is disposed outside the nozzle plate 21 in the X-axis direction. The bottom plate 22 is bonded to the bottom surface of the flow passage forming substrate 23 and covers the common reservoir 14 and the relay flow passages 15, 16 from below.

The common reservoir 14, the relay flow passages 15, 16, and the communication flow passages 18 are formed in the flow passage forming substrate 23. The common reservoir 14, the relay flow passages 16, and the communication flow passages 18 are openings going through the flow passage forming substrate 23 in the plate-thickness direction. The plate-thickness direction of the flow passage forming substrate 23 is along the Z axis. The relay flow passage 15 is a groove formed in the bottom surface of the flow passage forming substrate 23.

The pressure compartments 17 are formed in the pressure compartment forming substrate 24. The pressure compartments 17 are openings going through the pressure compartment forming substrate 24 in the plate-thickness direction. The length of the pressure compartment forming substrate 24 in the X-axis direction is less than the length of the flow passage forming substrate 23 in the X-axis direction. The pressure compartment forming substrate 24 is bonded to the top surface of the flow passage forming substrate 23.

Figure 3:
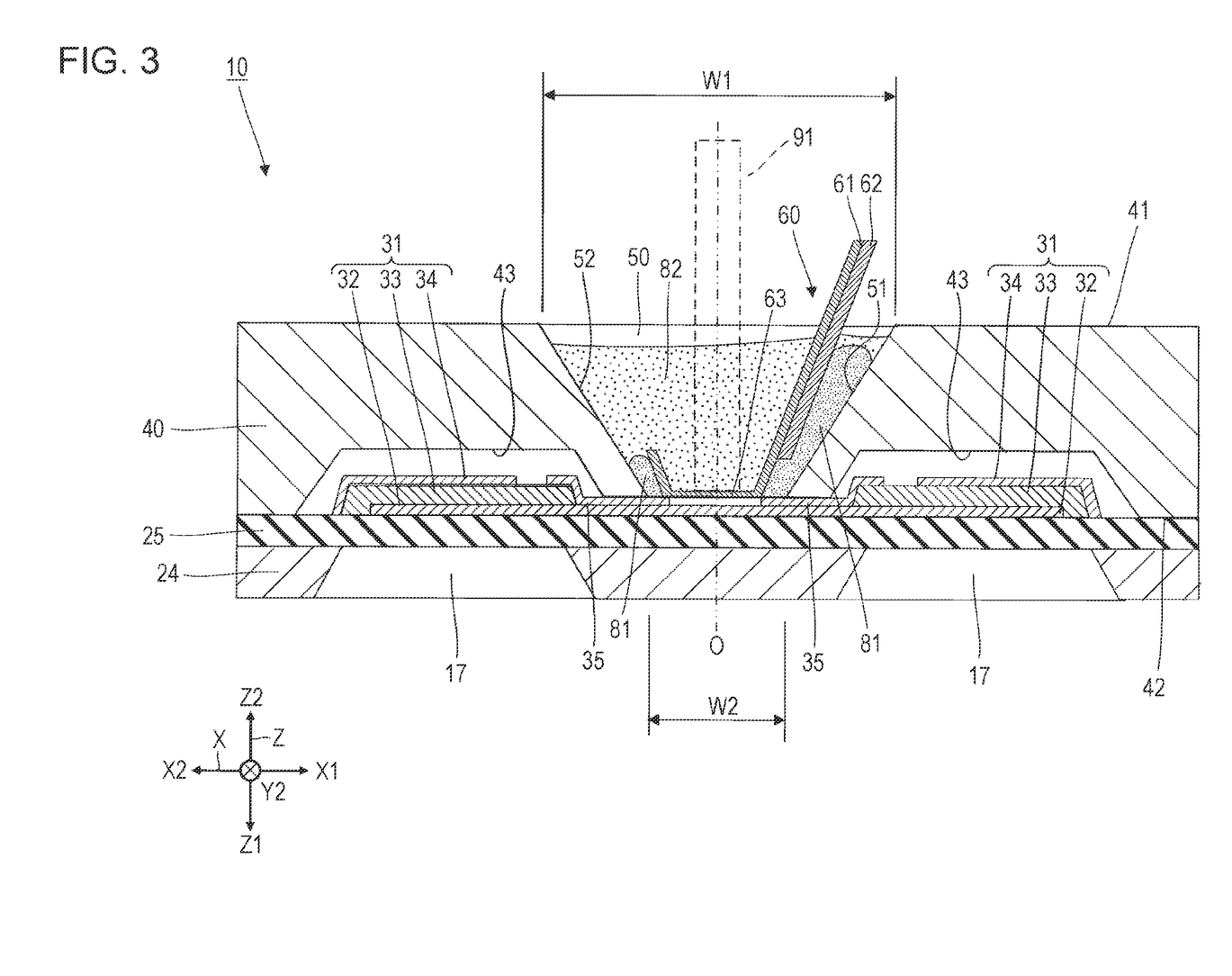
FIG. 3 is a cross-sectional view of a sealing plate, piezoelectric actuators, and a pressure compartment forming substrate of the liquid ejecting head.

FIG. 3 is a cross-sectional view of the sealing plate 40, the piezoelectric actuators 31, and the pressure compartment forming substrate 24 of the liquid ejecting head 10. As illustrated in FIG. 3, the diaphragm 25 is disposed on the top surface of the pressure compartment forming substrate 24. The plate-thickness direction of the diaphragm 25 is along the Z axis. The diaphragm 25 covers the openings of the pressure compartment forming substrate 24. The portion, of the diaphragm 25, covering the openings of the pressure compartment forming substrate 24 constitutes the ceiling of the pressure compartments 17. The diaphragm 25 is formed of a plurality of insulation layers. The diaphragm 25 includes a first insulation layer made of silicon dioxide ($SiO_2$) and a second insulation layer made of zirconium dioxide ($ZrO_2$). The first insulation layer is formed on the pressure compartment forming substrate 24. The second insulation layer is formed on the first insulation layer. The diaphragm 25 is driven by the piezoelectric actuator 31 and vibrates in the Z-axis direction.

The plurality of piezoelectric actuators 31 is disposed on the diaphragm 25. The plurality of piezoelectric actuators 31 is provided such that they correspond to the plurality of pressure compartments 17 respectively. The piezoelectric actuator 31 includes a lower electrode 32, a piezoelectric layer 33, and an upper electrode 34. The lower electrode 32, the piezoelectric layer 33, and the upper electrode 34 are stacked in this order on the diaphragm 25. The lower electrode 32 is an individual electrode(s). The upper electrode 34 is a common electrode. The common electrode may be the lower electrode. The individual electrode may be the upper electrode.

The lower electrodes 32 are arranged at predetermined intervals in the Y-axis direction. Each of the plurality of lower electrodes 32 is located at a position overlapping with the corresponding one of the plurality of pressure compartments 17 as viewed in the Z-axis direction. The lower electrode 32 has a predetermined length in the X-axis direction, and extends inward toward the center line O from the position over the pressure compartment 17.

The lower electrode 32 includes, for example, an electrode layer containing a conductive material having a low resistance such as platinum (Pt) or iridium (Ir), etc., and a ground layer containing titanium (Ti). The electrode layer may be made of oxide such as, for example, strontium ruthenate ($SrRuO_3$), lanthanum nickelate ($LaNiO_3$), etc.

The piezoelectric layer 33 is formed on the lower electrode 32. The piezoelectric layer 33 is disposed in such a way as to cover the plurality of lower electrodes 32. The piezoelectric layer 33 is a band-shaped dielectric film extending in the Y-axis direction.

The upper electrode 34 is formed on the piezoelectric layer 33. The upper electrode 34 extends in the Y-axis direction in such a way as to cover the plurality of lower electrodes 32, with the piezoelectric layer 33 sandwiched therebetween. The upper electrode 34 includes, for example, an electrode layer containing a conductive material having a low resistance such as Pt or Ir, etc., and a ground layer containing Ti. The electrode layer may be made of oxide such as, for example, $SrRuO_3$, $LaNiO_3$, etc.

The portion, of the piezoelectric layer 33, sandwiched between the lower electrode 32 and the upper electrode 34 serves as a drive region. The drive region overlaps with the pressure compartment 17 as viewed in the Z-axis direction. A non-drive region is formed around the drive region as viewed in the Z-axis direction. The lower electrode 32 and the upper electrode 34 do not overlap with each other at the non-drive region.

The liquid ejecting head 10 includes a plurality of lead electrodes 35 coupled to the plurality of lower electrodes 32 electrically. Each of the plurality of lead electrodes 35 is coupled to the corresponding one of the plurality of lower electrodes 32. The lead electrode 35 extends in the X-axis direction and is wired to reach the inside of the opening 50 of the sealing plate 40. The lead electrode 35 is electrically coupled to the COF 60 inside the opening 50.

The lead electrode 35 is made of a conductive material having a lower resistance than that of the lower electrode 32. For example, the lead electrode 35 is a conductive pattern having a layered structure obtained by forming a conductive film made of gold (Au) on the surface of a conductive film made of nichrome (NiCr).

Figure 4:
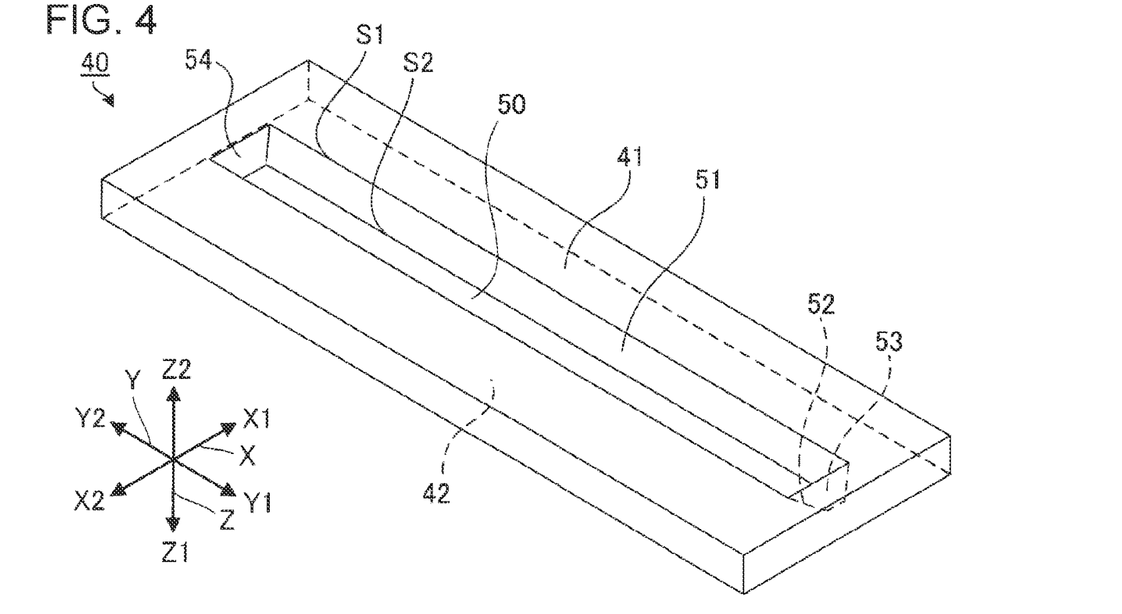
FIG. 4 is a perspective view of the sealing plate of the liquid ejecting head.
Figure 5:
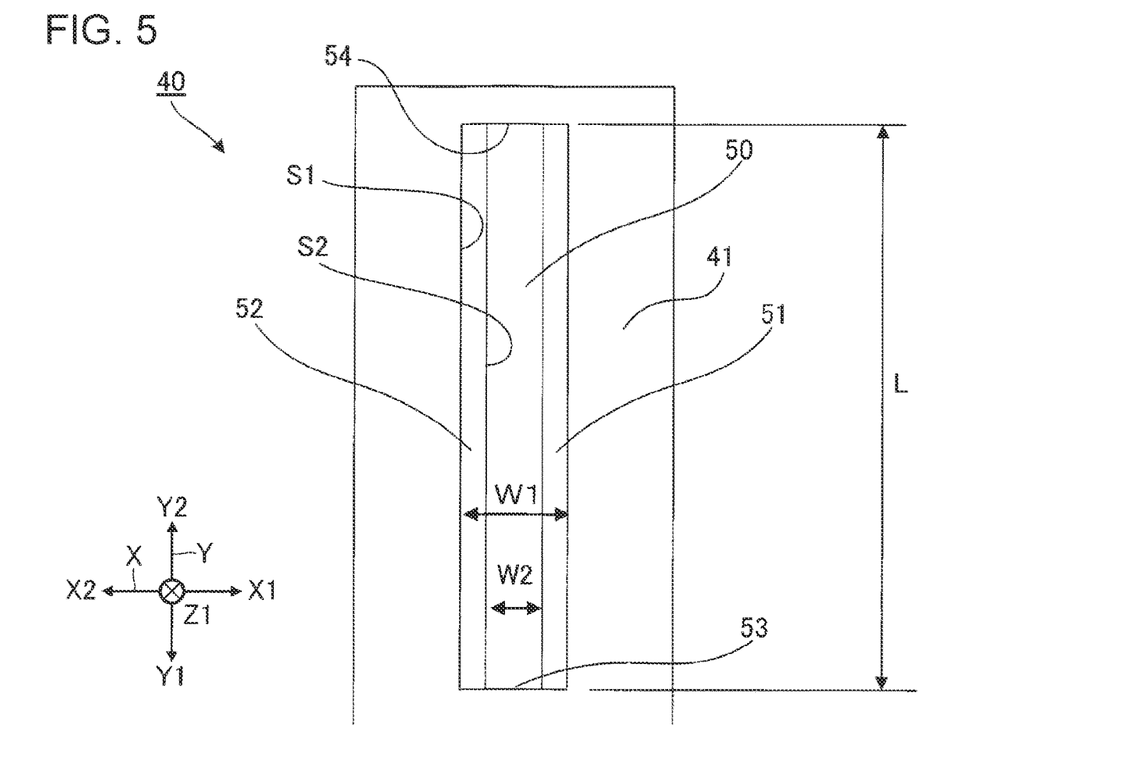
FIG. 5 is a plan view of the sealing plate of the liquid ejecting head.

The sealing plate 40 is disposed in such a way as to cover the plurality of piezoelectric actuators 31 from the Z2-directional side. FIG. 4 is a perspective view of the sealing plate 40. FIG. 5 is a plan view of the sealing plate 40. The sealing plate 40 has a rectangular shape as viewed in the Z-axis direction. The sealing plate 40 protects the plurality of piezoelectric actuators 31 and enhances the mechanical strength of the pressure compartment forming substrate 24 and the diaphragm 25.

The sealing plate 40 includes a first surface 41 and a second surface 42. The first surface 41 and the second surface 42 are at a distance from each other in the Z-axis direction. The first surface 41 is the surface oriented in the Z2 direction. The second surface 42 is the surface oriented in the Z1 direction. The second surface 42 is in contact with the diaphragm 25 as illustrated in FIG. 3. The second surface 42 is fixed to the diaphragm 25 by using, for example, an adhesive.

The sealing plate 40 has a recessed portion 43 for housing the piezoelectric actuators 31. The recessed portion 43 is located on both sides with respect to the opening 50 in the X-axis direction. The recessed portion 43 is recessed from the second surface 42. The recessed portion 43 extends in the Y-axis direction in such a way as to house the plurality of piezoelectric actuators 31 arranged next to one another in the Y-axis direction.

The opening 50 goes through the sealing plate 40 in the Z-axis direction. The opening 50 is continuous from the first surface 41 to the second surface 42. The opening 50 is surrounded and defined by inner wall surfaces 51 to 54. The inner wall surfaces 51 and 52 are at a distance from each other in the X-axis direction. The inner wall surfaces 53 and 54 are at a distance from each other in the Y-axis direction.

The inner wall surfaces 51 and 52 are inclined with respect to the Z-axis direction. The inner wall surfaces 51 and 52 extend in the Y-axis direction. The width W1 of the opening 50 at the first surface 41 is greater than the width W2 of the opening 50 at the second surface 42. The opening width W1, W2 is the length of the opening 50 in the X-axis direction. The length L of the opening 50 at the first surface 41 is equal to the length L of the opening 50 at the second surface 42. The area size S1 of the opening 50 at the first surface 41 is larger than the area size S1 of the opening 50 at the second surface 42.

Figure 6:
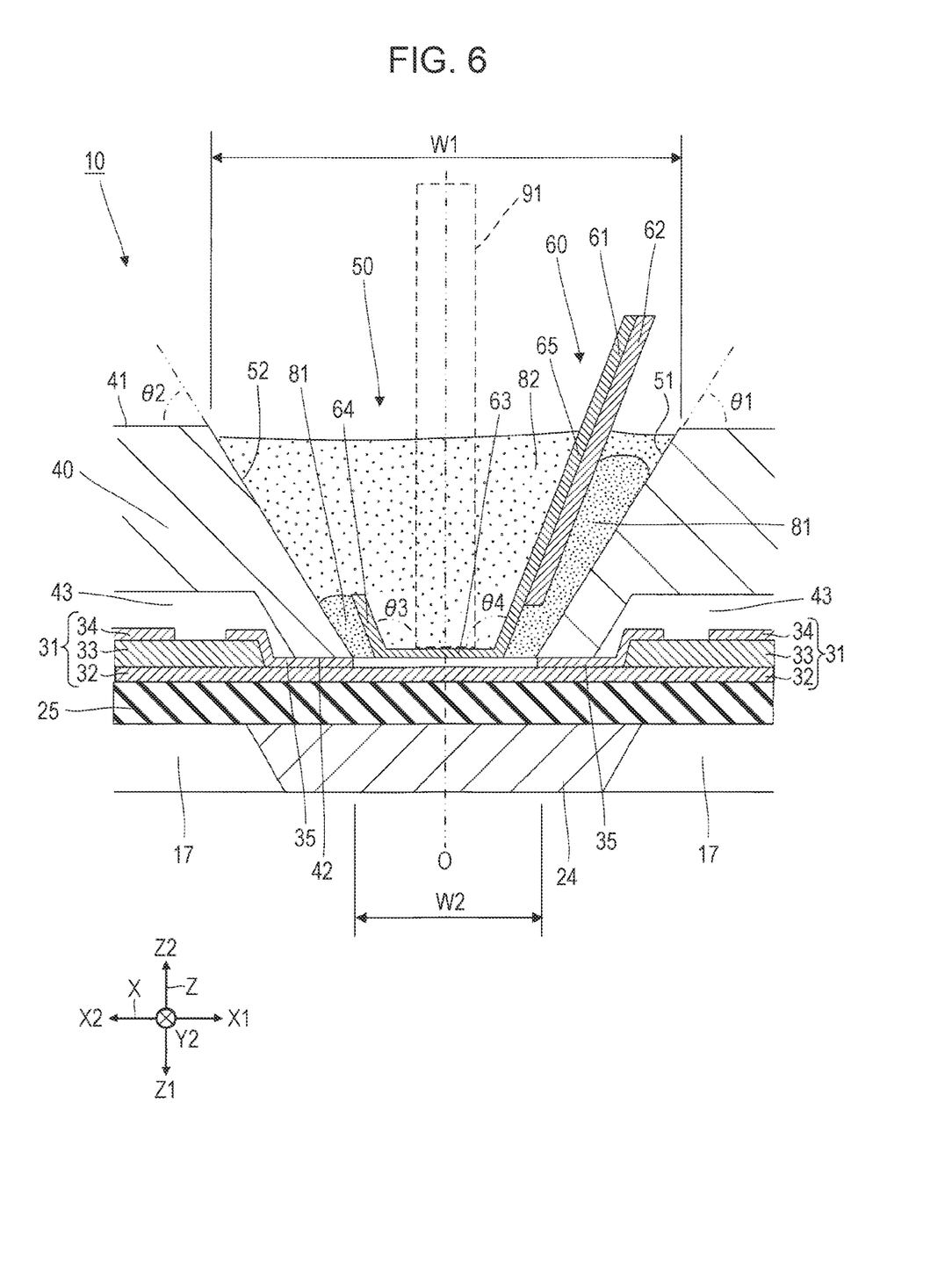
FIG. 6 is an enlarged cross-sectional view of an opening of the sealing plate.

FIG. 6 is an enlarged cross-sectional view of the opening 50 of the sealing plate 40. As illustrated in FIG. 6, the angle of inclination $\theta 1$ of the inner wall surface 51 with respect to the X-axis direction is an acute angle. For example, the angle of inclination $\theta 1$ of the inner wall surface 51 is 54.7°. The angle of inclination $\theta 2$ of the inner wall surface 52 with respect to the X-axis direction is the same as the angle of inclination $\theta 1$ of the inner wall surface 51 with respect to the X-axis direction. The inner wall surfaces 51 and 52 are line-symmetric with respect to the center line O.

The sealing plate 40 is made of a monocrystalline silicon substrate having preferential orientation of (100) at its surface perpendicular to the Z-axis direction. The monocrystalline silicon substrate is a preferential orientation substrate in which 50% or more of crystal in relation to a whole of crystal is oriented to the first surface 41. The monocrystalline silicon substrate may be a preferential orientation substrate in which 80% or more of crystal in relation to a whole of crystal is oriented to the first surface 41. The monocrystalline silicon substrate may be a preferential orientation substrate in which 90% or more of crystal in relation to a whole of crystal is oriented to the first surface 41. The inner wall surfaces 51 and 52 each having a slope of 54.7° are formed by wet-etching a monocrystalline silicon substrate using a strongly basic aqueous solution such as a potassium hydroxide solution (KOH), etc. By forming a $SiO_2$ film, it is possible to stop the etching of the silicon substrate by the strongly basic aqueous solution. If the sealing plate 40 is made of a monocrystalline silicon substrate, it is possible to form the inclined surface easily by wet etching.

The COF 60 is inserted in the opening 50 and is electrically coupled to the piezoelectric actuator 31 via the lead electrode 35. The COF 60 includes a flexible wiring board 61 and a driver IC 62. The flexible wiring board 61 is a wiring board that has flexibility. The flexible wiring board 61 is, for example, an FPC (Flexible Printed Circuit). The flexible wiring board 61 may be, for example, an FFC (Flexible Flat Cable).

The flexible wiring board 61 has a plurality of layers. The flexible wiring board 61 may include, for example, a polyimide base material, a copper foil, a gold plating layer, an insulating layer, an adhesive layer, or a solder resist.

The flexible wiring board 61 includes a connection portion 63, a part (a portion) 64, and another part (another portion) 65. The connection portion 63 is disposed at the bottom of the opening 50 and is electrically coupled to the lead electrodes 35. The bottom of the opening 50 is the face that is closer to the second surface 42 of the sealing plate 40 in the Z-axis direction than the opposite face is. The plate-thickness direction of the connection portion 63 is along the Z axis. The connection portion 63 has a predetermined width in the X-axis direction and extends in the Y-axis direction. The connection portion 63 is disposed in such a way as to cover the plurality of lead electrodes 35 from the Z2-directional side.

The part 64 of the flexible wiring board 61 is bent from the connection portion 63. As viewed in the Y1 direction, the part 64 of the flexible wiring board 61 extends obliquely upward from the connection portion 63. The rising angle $\theta 3$ of the part 64 with respect to the connection portion 63 is an obtuse angle. The part 64 extends in an X2-and-Z2 direction. There is a predetermined clearance between the part 64 and the inner wall surface 52. The part 64 is located inside the opening 50.

The part 65 of the flexible wiring board 61 is bent from the connection portion 63. As viewed in the Y1 direction, the part 65 of the flexible wiring board 61 extends obliquely upward from the connection portion 63. The rising angle $\theta 4$ of the part 65 with respect to the connection portion 63 is an obtuse angle. The part 65 extends toward the opposite side away from the part 64 in the X-axis direction. The part 65 extends in an X1-and-Z2 direction. There is a predetermined clearance between the part 65 and the inner wall surface 51. The part 65 extends up to the outside of the opening 50. The part 65 is electrically coupled to a wiring board that is not illustrated. The flexible wiring board 61 is electrically coupled to a wiring board, a relay board, and a connector.

The driver IC 62 is mounted on the flexible wiring board 61. More specifically, the driver IC 62 is mounted on, of the flexible wiring board 61, the surface oriented toward the inner wall surface 51. There is a predetermined clearance between the driver IC 62 and the inner wall surface 51.

The driver IC 62 is electrically coupled to the control unit 3 via the flexible wiring board 61. The driver IC 62 receives a command signal outputted from the control unit 3. In response to the command signal, the driver IC 62 supplies a drive signal to each piezoelectric actuator 31 to cause the diaphragm 25 to vibrate.

The COF 60 is bonded to the diaphragm 25 by an adhesive 81 disposed inside the opening 50. The adhesive 81 is an example of a first adhesive. The part 64 is bonded to the inner wall surface 52 by the adhesive 81. The part 65 and the driver IC 62 are bonded to the inner wall surface 51. The connection portion 63 is bonded to the diaphragm 25 by the adhesive 81. The adhesive 81 is disposed on the area of the diaphragm 25 between the lead electrodes 35 arranged adjacent to one another in the Y-axis direction. The connection portion 63 is bonded to the diaphragm 25, with the adhesive 81 applied therebetween.

The adhesive 81 is a non-conductive adhesive that does not contain a conductor such as, for example, conductive particles. For example, the adhesive 81 may be a non-conductive adhesive paste (NCP: Non-Conductive Paste) or a non-conductive adhesive film (NCF: Non-Conductive Film). The adhesive 81 may be an anisotropic conductive adhesive in which a plurality of conductive particles is dispersed. The anisotropic conductive adhesive is, for example, an anisotropic conductive film (ACF: Anisotropic Conductive Film) or an anisotropic conductive paste (ACP: Anisotropic Conductive Paste). If the adhesive 81 is a non-conductive adhesive, high-density mounting will be easier as compared with a case where an ACF or an ACP is used.

The adhesive 81 is sealed by an adhesive 82 disposed inside the opening 50. The adhesive 82 is an example of a second adhesive. The COF 60 is bonded indirectly to the pressure compartment forming substrate 24, with the diaphragm 25 interposed therebetween, in the Z-axis direction. The connection portion 63 disposed inside the opening 50 is sealed by the adhesive 82. The adhesive 82 may be a potting agent or a sealant.

Next, with reference to FIG. 6, a method of mounting the COF 60 in the liquid ejecting head 10 will now be explained. Prior to the mounting of the COF 60, the plurality of piezoelectric actuators 31 is formed by producing, on the pressure compartment forming substrate 24, a layered structure made up of the diaphragm 25, the lower electrode 32, the piezoelectric layer 33, and the upper electrode 34, and the lead electrodes 35. After the plurality of piezoelectric actuators 31 is formed, the sealing plate 40 is mounted over the plurality of piezoelectric actuators 31 by bonding.

The sealing plate 40 has the opening 50. The plurality of lead electrodes 35 is exposed to the inside of the opening 50. The part 64 of the flexible wiring board 61 is bent from the connection portion 63 at an obtuse angle. The part 65 of the flexible wiring board 61 is also bent from the connection portion 63 at an obtuse angle. Prior to the mounting of the COF 60, the driver IC 62 is mounted on the part 65 of the flexible wiring board 61.

The adhesive 81 is disposed on the diaphragm 25 and the lead electrodes 35 inside the opening 50. The COF 60 is inserted into the opening 50 in the Z1 direction. The connection portion 63 is disposed on the diaphragm 25 and the lead electrodes 35 at the bottom of the opening 50.

When the connection portion 63 that is being inserted approaches the second surface 42, the connection portion 63 comes into contact with the adhesive 81, and a part of the adhesive 81 is forced to go outward in the X-axis direction. A part of the adhesive 81 moves in the X2 direction into the gap between the part 64 of the flexible wiring board 61 and the inner wall surface 52. Another part of the adhesive 81 moves in the X1 direction into the gap between the part 65 of the flexible wiring board 61 and the inner wall surface 51 and the gap between the driver IC 62 and the inner wall surface 51. Still another part of the adhesive 81 stays on the diaphragm 25 and contributes to the bonding of the connection portion 63 and the diaphragm 25 to each other.

A tool 91 is inserted into the opening 50 in the Z1 direction. In FIG. 6, the tool 91 is shown by broken-line illustration. The tool 91 is a mounting tool. The tool 91 pushes the connection portion 63 in the Z1 direction and applies heat thereto. Therefore, the adhesive 81 is heated to cure, the connection portion 63 becomes bonded to the diaphragm 25, and the wiring of the COF 60 becomes electrically coupled to the lead electrodes 35.

Next, the tool 91 is taken out of the opening 50, and then the opening 50 is filled with the adhesive 82, thereby sealing the connection portion 63 and the lead electrodes 35. The COF 60 is mounted onto the lead electrodes 35 in this way.

In the liquid ejecting head 10 described above, the inner wall surfaces 51 and 52 of the opening 50 are sloped, and the opening width W1 at the first surface 41 is greater than the opening width W2 at the second surface 42. The opening 50 is widest at the first surface 41 and becomes narrower from the first surface 41 toward the second surface 42, at which it is narrowest. This structure reduces the risk of contact of the tool 91 with the inner wall surface 51, 52 when the tool 91 is inserted into the opening 50. Similarly, this structure reduces the risk of contact of the flexible wiring board 61 and the driver IC 62 with the inner wall surface 51, 52 when the COF 60 is inserted into the opening 50. With the liquid ejecting head 10 described above, the electric coupling of the COF 60 becomes easier.

In the liquid ejecting head 10, as described above, the width W1 of the opening 50 is greater than the width W2 of the opening 50. Therefore, unlike related art, there is no need to bend the part 65 from the connection portion 63 at a right angle. Namely, in the COF 60, the part 65 is bent from the connection portion 63 at an obtuse angle. Because of this structure, the flexible wiring board 61 is bent at an angle that is gentler than that of related art. Consequently, the risk of occurrence of wire breakage and migration at the bent portion of the flexible wiring board 61 decreases.

For example, if the angle of the bent portion of the flexible wiring board 61 is a right angle, the possibility of occurrence of wire breakage and migration will be higher as compared with a structure in which the angle of the bent portion is an obtuse angle as in θ3. In this respect, in the liquid ejecting head 10, since the angle of the bent portion can be made gentler, it is possible to reduce the risk of exposure of wiring Cu caused by cracking of Au plating that covers wires. Since the structure of the liquid ejecting head 10 makes it possible to reduce the risk of occurrence of wire breakage and migration at the bent portion of the flexible wiring board 61, the reliability of the liquid ejecting head 10 improves.

In the liquid ejecting head 10, the inner wall surfaces 51 and 52 of the opening 50 are sloped, the part 64 is formed on one side with respect to the connection portion 63, and the part 65 is formed on the opposite side with respect to the connection portion 63. Because of this structure, even if the adhesive 81 disposed on the Z1-directional side with respect to the connection portion 63 moves to both sides in the X-axis direction, the presence of the parts 64 and 65 prevents the adhesive 81 from entering an inner space on the Z2-directional side with respect to the connection portion 63. In the liquid ejecting head 10, it is possible to prevent the adhesive 81 from climbing up into the inner space on the Z2-directional side with respect to the connection portion 63. Therefore, the adhesive 81 will not get on the tool 91 when the COF 60 is mounted using the tool 91.

Moreover, in the liquid ejecting head 10, since the bent portion of the flexible wiring board 61 is covered by the adhesive 81, it is possible to protect the bent portion by the adhesive 81. For example, of the flexible wiring board 61, the portion that is not covered by a solder resist may be covered by the adhesive 81. As described here, it is possible to protect the flexible wiring board 61 by the adhesive 81 that is present inside the opening 50. Therefore, it is possible to enhance the reliability of electric coupling in the liquid ejecting head 10.

In the liquid ejecting head 10, since the inner wall surfaces 51 and 52 of the opening 50 are sloped, it is easier to dispose the adhesive 81 near the Z1-side end of the inner wall surface 51 and the Z1-side end of the inner wall surface 52. For example, as compared with a structure in which the inner wall surfaces of the opening are perpendicular to the X-axis direction, it is easier to dispose the adhesive 81 without a clearance. Therefore, in the liquid ejecting head 10, the adhesive 81 can be disposed appropriately without being applied excessively.

In the liquid ejecting head 10, the flexible wiring board 61 and the pressure compartment forming substrate 24 are bonded by means of the adhesive 81. Since the flexible wiring board 61 is electrically bonded by using the adhesive 81, the reliability of electric coupling improves.

In the liquid ejecting head 10, the adhesive 81, the connection portion 63, and the lead electrodes 35 are sealed by the adhesive 82 disposed inside the opening 50. Since it is possible to protect the adhesive 81, the connection portion 63, and the lead electrodes 35 by the adhesive 82, the reliability of electric coupling in the liquid ejecting head 10 improves. Moreover, since the connection portion 63 and the lead electrodes 35 are protected from moisture, etc. by the adhesive 82, the life of the connection portion 63 and the lead electrodes 35 becomes longer.

In the liquid ejecting head 10, since it is possible to prevent the adhesive 81 from entering the inner space on the Z2-directional side with respect to the connection portion 63, even if the adhesive 81 is disposed more roughly as compared with related art, it is possible to mount the COF 60 onto the lead electrodes 35 without impairing the reliability.

In the liquid ejecting head 10, the opening width W2 at the second surface 42 may be made less than that of related art by adjusting the slope of the inner wall surfaces 51 and 52 of the opening 50. By this means, it is possible to prevent the contact of the COF 60 with the inner wall surface 51, 52 while reducing the opening width W2.

Moreover, a reduction in the opening width W2 makes it possible to arrange the rows of the pressure compartments 17 closer to each other in the X-axis direction. The rows of the nozzles N may be arranged closer to each other in the X-axis direction. This makes it possible for the liquid ejecting apparatus 1 to perform high-density printing.

Figure 7:
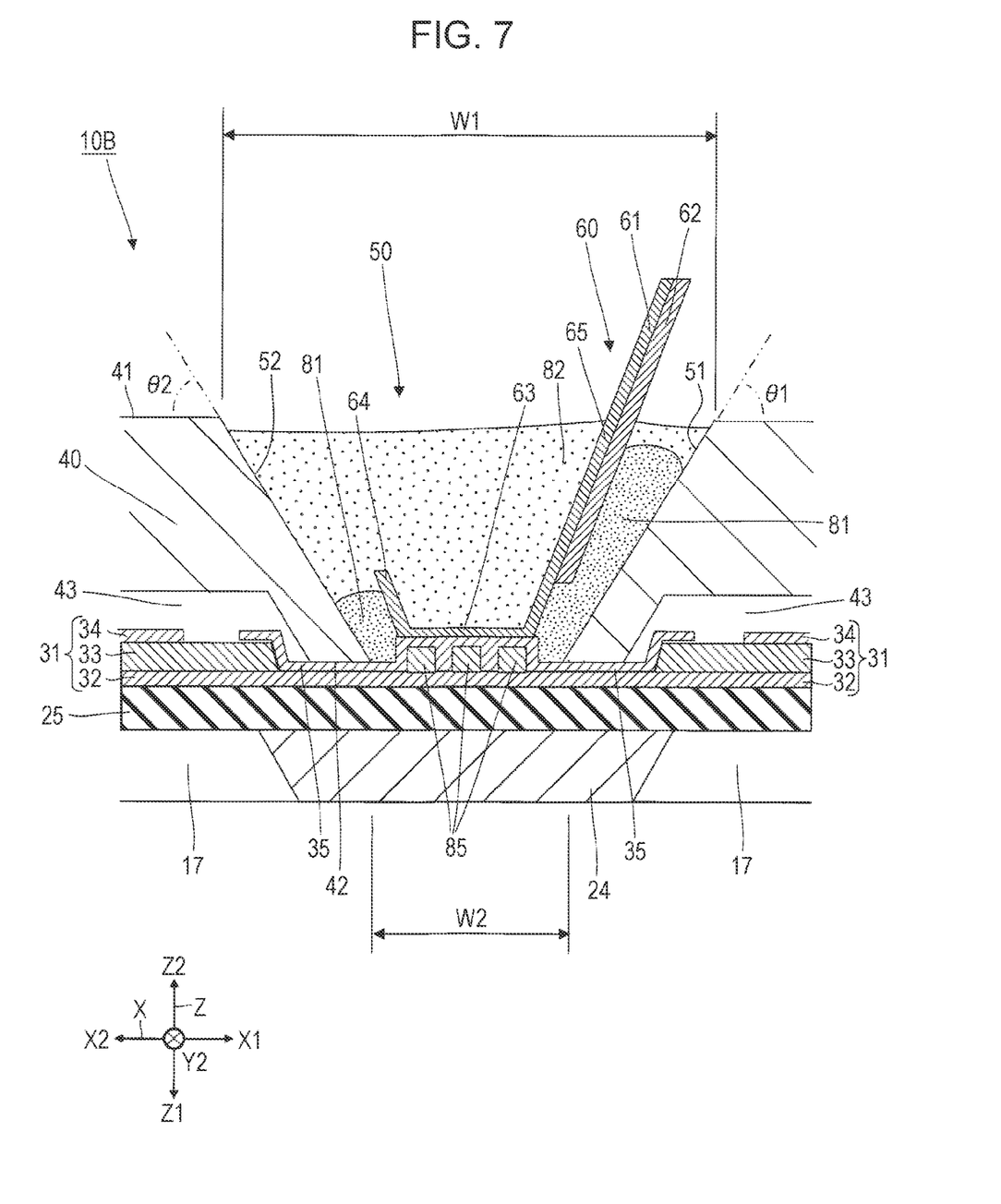
FIG. 7 is an enlarged cross-sectional view of an opening of a sealing plate of a liquid ejecting head according to a second embodiment.

Next, with reference to FIG. 7, a liquid ejecting head 10B according to a second embodiment will now be explained. FIG. 7 is an enlarged cross-sectional view of the opening 50 of the sealing plate 40 of the liquid ejecting head 10B according to the second embodiment. The liquid ejecting head 10B according to the second embodiment is different from the liquid ejecting head 10 according to the first embodiment in that, firstly, a plurality of convex portions 85 is formed under the connection portion 63, and, secondly, the lead electrodes 35 are formed between the connection portion 63 and the plurality of convex portions 85. In the description of the second embodiment below, the same explanation as that of the first embodiment will not be given.

The plurality of convex portions 85 is, for example, formed of the piezoelectric layer. The plurality of convex portions 85 is formed at the same time as the forming of the piezoelectric layer 33 of the piezoelectric actuators 31. A plurality of concave portions is formed by partially removing the piezoelectric layer by etching the piezoelectric layer. The plurality of convex portions 85 is the piezoelectric layer remaining between the concave portions. These convex portions 85 and concave portions constitute a convex-and-concave shape pattern. A part of the lead electrodes 35 is formed on the convex portions 85. A part of the lead electrodes 35 may exist between the convex portions 85 in the X-axis direction.

The convex portion 85 projects in the Z2 direction with respect to the lower electrode 32. Each of the plurality of convex portions 85 extends in the Y-axis direction. As viewed in the Z-axis direction, the convex portions 85 are arranged at positions where they overlap with the opening 50. The plurality of convex portions 85 may be formed in such a way as to project from the pressure compartment forming substrate 24. The convex-and-concave shape pattern may be provided under the wiring of the pressure compartment forming substrate 24.

The plurality of convex portions 85 may project beyond the second surface 42 of the sealing plate 40 in the Z2 direction. In this case, the connection portion 63 is disposed at a position more distant from the second surface 42 in the Z2 direction. Therefore, it is possible to adjust the gap between the COF 60 and the inner wall surface 51, 52. For example, it is possible to make the gap between the COF 60 and the inner wall surface 51, 52 wider.

The liquid ejecting head 10B according to the second embodiment having this structure produces the same operational effects as those of the liquid ejecting head 10 according to the first embodiment. In the liquid ejecting head 10B, since the plurality of convex portions 85 is provided, it is possible to bond the connection portion 63 and the lead electrodes 35 to each other well. If there is a convex-and-concave shape pattern including the convex portions 85, stress will concentrate in a desirable way when the connection portion 63 and the lead electrodes 35 are bonded together. Therefore, the reliability of electric coupling improves.

If the concave portions are formed under the wiring of the connection portion 63, a larger amount of the adhesive 81 will be used as compared with a structure in which the concave portions do not exist. In the liquid ejecting head 10B, since the inner wall surfaces 51 and 52 of the opening 50 are sloped, even if a larger amount of the adhesive 81 is used, it is possible to prevent the vertical climbing of the adhesive 81 and thus possible to electrically couple the connection portion 63 well. Even if a larger amount of the adhesive 81 is used, the risk of adhesion of the adhesive 81 to the tool 91 for mounting decreases.

Moreover, in the liquid ejecting head 10B, it is possible to guide the adhesive 81 by the convex-and-concave shape pattern including the convex portions 85 when the COF 60 is mounted. The guiding makes it easier to dispose the adhesive 81 appropriately. Therefore, it is possible to bond the connection portion 63 to the diaphragm 25 securely. Consequently, it is possible to enhance the reliability of the liquid ejecting head 10B.

Figure 8:
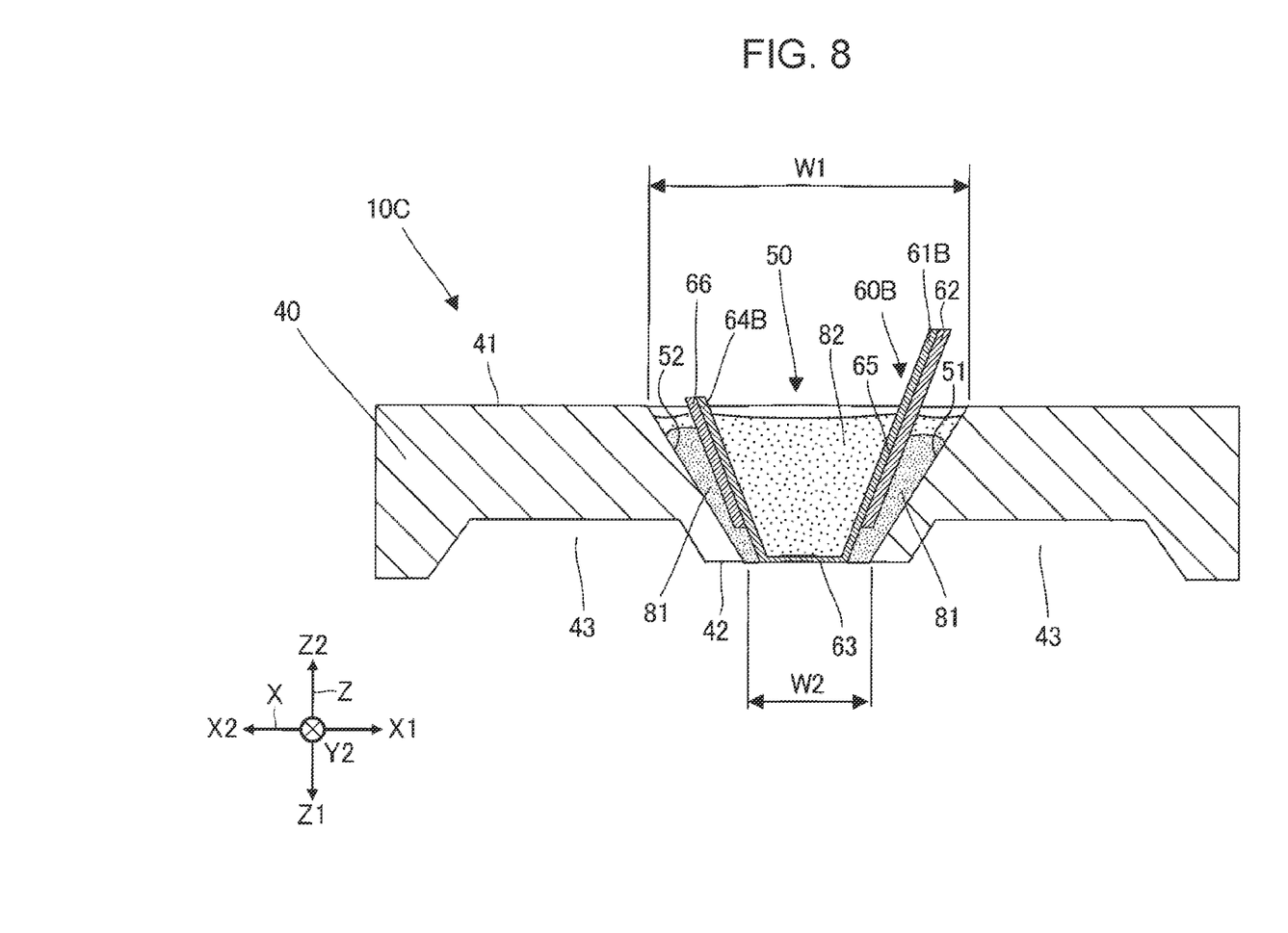
FIG. 8 is a cross-sectional view of a sealing plate of a liquid ejecting head according to a first modification example.

Next, with reference to FIG. 8, a liquid ejecting head 10C according to a first modification example will now be explained. FIG. 8 is a cross-sectional view of the sealing plate 40 of the liquid ejecting head 10C according to the first modification example. The liquid ejecting head 10C according to the first modification example is different from the liquid ejecting head 10 according to the first embodiment in that, firstly, the liquid ejecting head 10C includes, instead of the part 64, a part 64B that is longer than the part 64, and, secondly, a driver IC 66 is mounted on the part 64B. In the description of the first modification example below, the same explanation as that of the first embodiment will not be given.

The liquid ejecting head 10C includes a COF 60B. The COF 60B includes a flexible wiring board 61B, the driver IC 62, and the driver IC 66. The flexible wiring board 61B includes the connection portion 63, a part 64B, and the part 65. The liquid ejecting head 10C includes the driver IC 62 mounted on the part 65 and the driver IC 66 mounted on the part 64B. The part 65 is an example of a first portion. The part 64B is an example of a second portion. The driver IC 62 is an example of a first integrated circuit. The driver IC 66 is an example of a second integrated circuit.

The driver IC 66 is disposed on, of the part 64B, the surface that is closer to the inner wall surface 52. The liquid ejecting head 10C having this structure also produces the same operational effects as those of the liquid ejecting head 10. In the liquid ejecting head 10C, since the part 64B extends up to the outside of the opening 50, it is possible to prevent the adhesive 81 from entering the inner space on the Z2-directional side with respect to the connection portion 63. Therefore, the adhesive 81 will not get on the tool 91 when the COF 60B is mounted using the tool 91.

Figure 9:
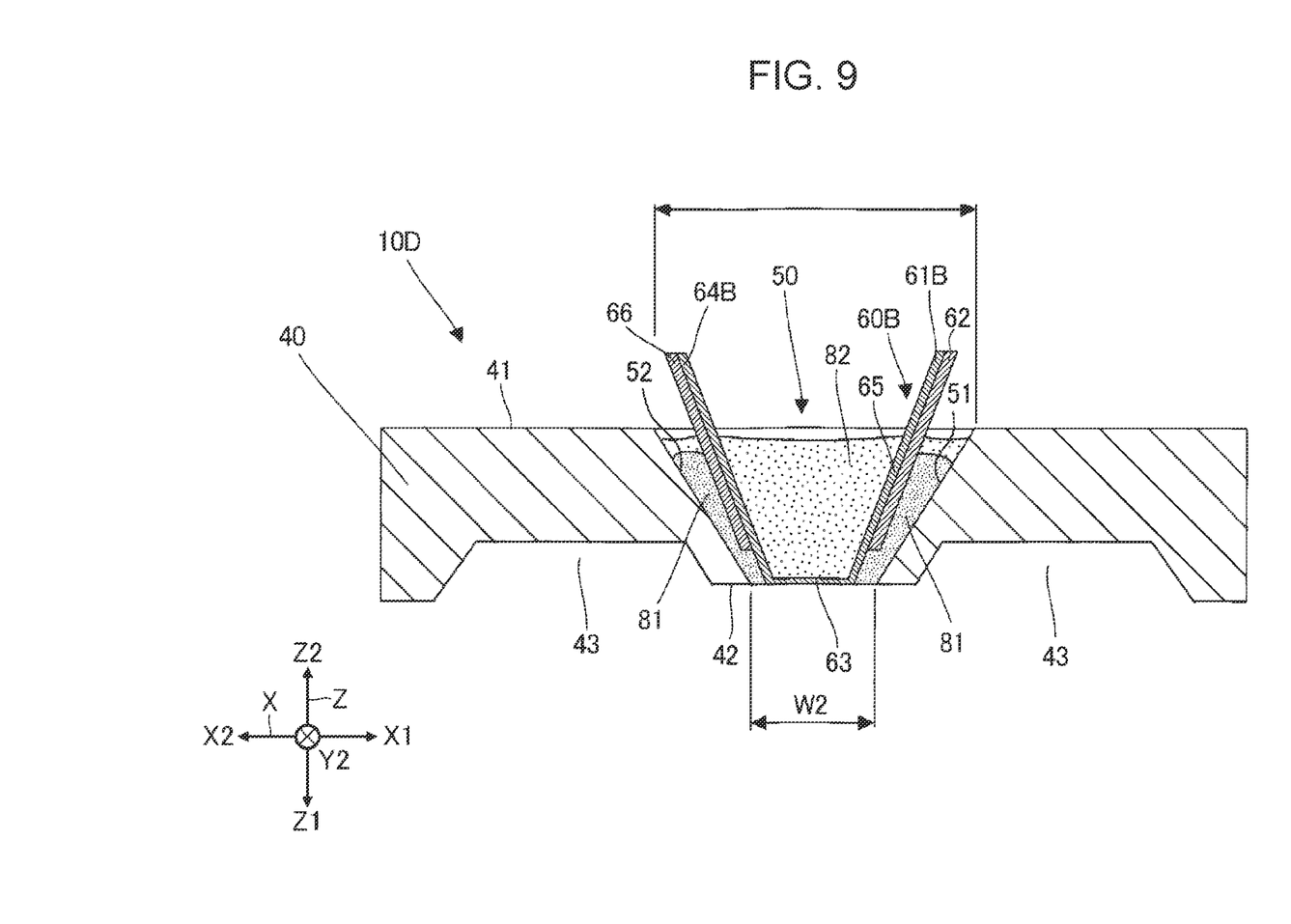
FIG. 9 is a cross-sectional view of a sealing plate of a liquid ejecting head according to a second modification example.

Next, with reference to FIG. 9, a liquid ejecting head 10D according to a second modification example will now be explained. FIG. 9 is a cross-sectional view of the sealing plate 40 of the liquid ejecting head 10D according to the second modification example. The liquid ejecting head 10D according to the second modification example is different from the liquid ejecting head 10C according to the first modification example in that the part 64B and the driver IC 66 are disposed further up to the outside of the opening 50.

The liquid ejecting head 10D according to the second modification example having this structure also produces the same operational effects as those of the foregoing liquid ejecting head 10, 10C. Moreover, since the driver IC 62 is disposed on one side with respect to the connection portion 63 in the X-axis direction and since the driver IC 66 is disposed on the opposite side with respect thereto, it is possible to support the flexible wiring board 61B over the diaphragm 25 in a well-balanced manner.

Figure 10:
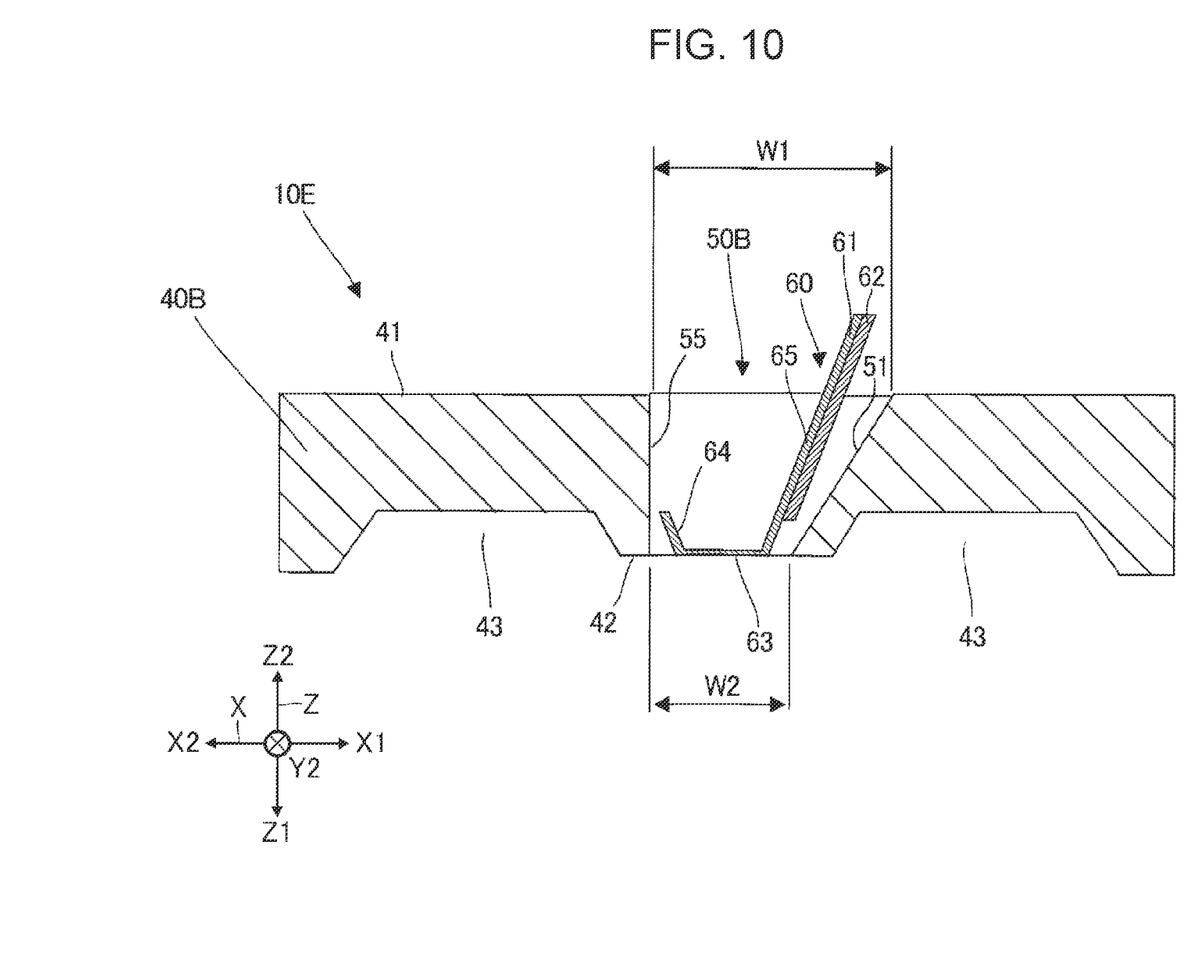
FIG. 10 is a cross-sectional view of a sealing plate of a liquid ejecting head according to a third modification example.

Next, with reference to FIG. 10, a liquid ejecting head 10E according to a third modification example will now be explained. FIG. 10 is a cross-sectional view of a sealing plate 40B of the liquid ejecting head 10E according to the third modification example. The liquid ejecting head 10E is different from the liquid ejecting head 10 according to the first embodiment in that its opening 50B has a cross-sectional shape different from that of the opening 50. In the description of the third modification example below, the same explanation as that of the first embodiment will not be given.

The liquid ejecting head 10E includes the sealing plate 40B in which the opening 50B is formed. The opening 50B has inner wall surfaces 51 and 55 that are at a distance from each other in the X-axis direction. The inner wall surface 51 is sloped. The inner wall surface 55 is along the Z axis. More specifically, the inner wall surface 51, which is closer to the part 65, is an inclined surface, and the inner wall surface 55, which is closer to the part 64 that is shorter than the part 65, extends in the X-axis direction. The liquid ejecting head 10E according to the third modification example having this structure also produces the same operational effects as those of the liquid ejecting head 10 according to the first embodiment.

Figure 11:
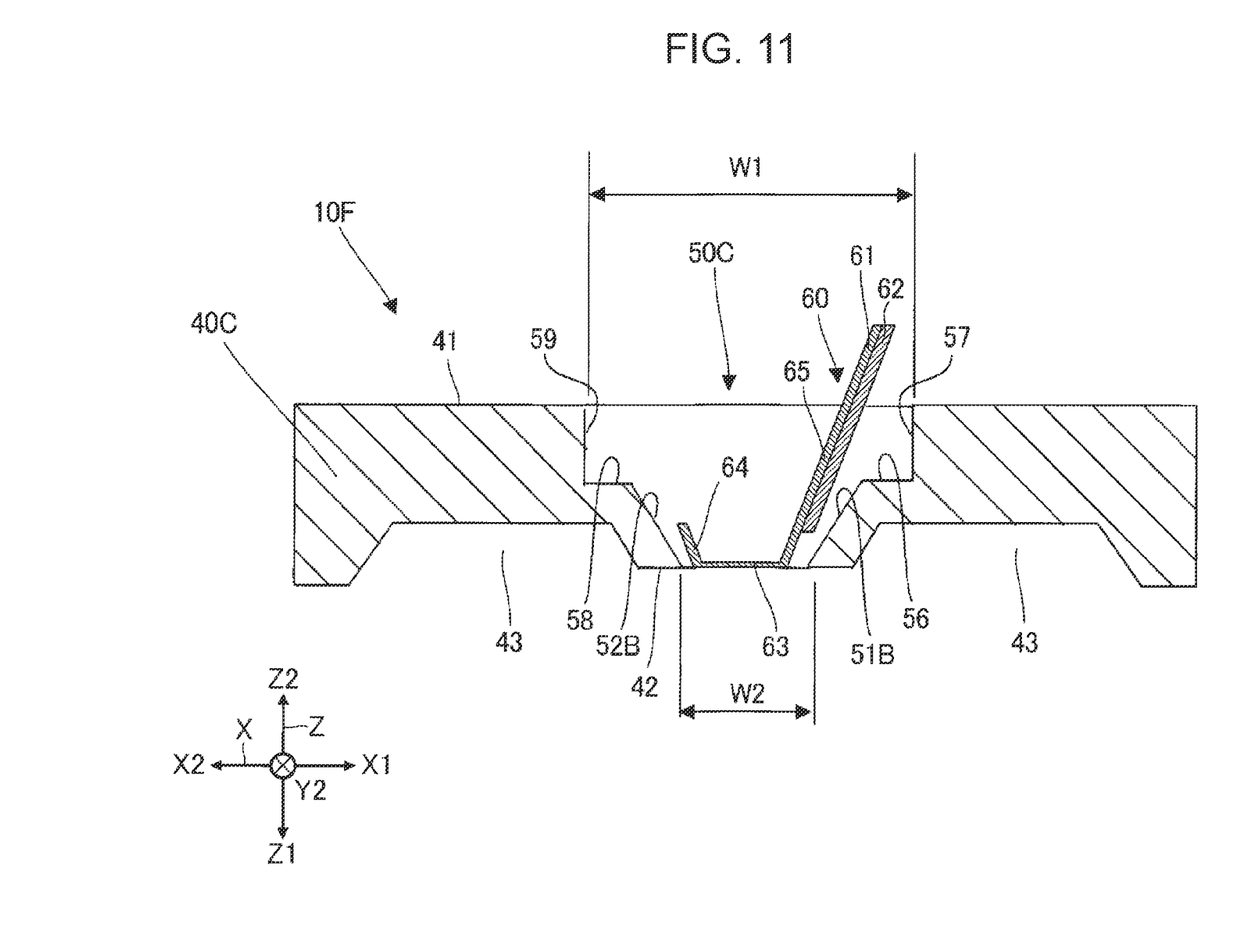
FIG. 11 is a cross-sectional view of a sealing plate of a liquid ejecting head according to a fourth modification example.

Next, with reference to FIG. 11, a liquid ejecting head 10F according to a fourth modification example will now be explained. FIG. 11 is a cross-sectional view of a sealing plate 40C of the liquid ejecting head 10F according to the fourth modification example. The liquid ejecting head 10F is different from the liquid ejecting head 10 according to the first embodiment in that its opening 50C has a cross-sectional shape different from that of the opening 50.

The liquid ejecting head 10F includes the sealing plate 40C in which the opening 50C is formed. The opening 50C has inner wall surfaces 51B and 52B, which are inclined with respect to the X-axis direction, inner wall surfaces 56 and 58, which are along the X axis, and inner wall surfaces 57 and 59, which are along the Z axis. The inner wall surface 51B is sloped, likewise the inner wall surface 51 according to the first embodiment. The inner wall surface 51B extends obliquely up to a position that is approximately the half of the thickness of the sealing plate 40C in the Z-axis direction. The inner wall surface 56 extends in the X1 direction from the Z1-side end of the inner wall surface 51B. The inner wall surface 57 extends in the Z2 direction from the X1-side end of the inner wall surface 56.

The inner wall surface 52B is sloped, likewise the inner wall surface 52 according to the first embodiment. The inner wall surface 52B extends obliquely up to a position that is approximately the half of the thickness of the sealing plate 40C in the Z-axis direction. The inner wall surface 58 extends in the X2 direction from the Z1-side end of the inner wall surface 52B. The inner wall surface 59 extends in the Z2 direction from the X2-side end of the inner wall surface 58.

Among the inner wall surfaces surrounding and defining the opening 50C, the inner wall surfaces 56 and 58 are step surfaces. As described here, the sealing plate 40C may have a stepped inner-wall-surface structure. The liquid ejecting head 10F according to the fourth modification example having this structure also produces the same operational effects as those of the liquid ejecting head 10 according to the first embodiment.

The foregoing embodiment merely discloses typical examples of the present disclosure. The scope of the present disclosure is not limited to the foregoing embodiment. Various modifications and additions, etc. can be made within a range not departing from the gist of the present disclosure.

In the foregoing embodiment, the liquid ejecting apparatus 1 that is a so-called serial-type device configured to reciprocate the carriage 5 on which the liquid ejecting head 10 is mounted has been described to show some examples. However, the present disclosure may be applied to a so-called line-type liquid ejecting apparatus in which the plural nozzles N are arranged throughout the entire width of the medium P.

In the foregoing embodiment, the common reservoir 13 is formed in the cover 70. However, a part of the ink flow passages 11 such as the common reservoir 13 may be formed in the sealing plate 40.

The liquid ejecting apparatus 1 disclosed as examples in the foregoing embodiment can be applied to not only print-only machines but also various kinds of equipment such as facsimiles and copiers, etc. The scope of application of a liquid ejecting apparatus according to the present disclosure is not limited to printing. For example, a liquid ejecting apparatus that ejects a colorant solution can be used as an apparatus for manufacturing a color filter of a display device such as a liquid crystal display panel. A liquid ejecting apparatus that ejects a solution of a conductive material can be used as a manufacturing apparatus for forming wiring lines and electrodes of a wiring substrate. A liquid ejecting apparatus that ejects a solution of a living organic material can be used as a manufacturing apparatus for, for example, production of biochips.

The actuator 31 disclosed as examples in each embodiment may be used for devices such as, for example, an ultrasonic wave transmitter, an ultrasonic motor, a piezoelectric transformer, a piezoelectric speaker, a piezoelectric pump, a pressure-electricity converter, and the like.

What is claimed is:

1. A liquid ejecting head, comprising:
   a pressure compartment forming substrate in which a pressure compartment is formed;
   a piezoelectric actuator disposed over the pressure compartment;
   a sealing plate that forms an opening going from a first surface, which is farther from the pressure compartment, to a second surface, which is closer to the pressure compartment, the sealing plate being configured to cover the piezoelectric actuator located in a first direction with respect to the opening; and
   a flexible wiring board inserted in the opening and including a connection portion electrically coupled to the piezoelectric actuator; wherein
   a first opening width of the opening at the first surface in the first direction is greater than a second opening width of the opening at the second surface in the first direction,
   as viewed in a second direction that is orthogonal to a thickness direction of the sealing plate and orthogonal to the first direction, the entire connection portion extends in the first direction orthogonal to the thickness direction of the sealing plate and is disposed inside the opening at the second surface.

2. The liquid ejecting head according to claim 1, wherein the flexible wiring board is bonded to the pressure compartment forming substrate by a first adhesive disposed in the opening.

3. The liquid ejecting head according to claim 1, wherein the first adhesive is sealed by a second adhesive disposed in the opening.

4. The liquid ejecting head according to claim 2, wherein the first adhesive is a non-conductive adhesive.

5. The liquid ejecting head according to claim 1, wherein in a cross section taken in a thickness direction of the sealing plate, as viewed in the second direction, a wall surface of the sealing plate forming the opening is inclined at an acute angle with respect to the first direction.

6. The liquid ejecting head according to claim 5, wherein the acute angle is 54.7°.

7. The liquid ejecting head according to claim 1, wherein a convex portion that projects toward the connection portion is formed under the connection portion.

8. The liquid ejecting head according to claim 1, wherein the connection portion is sealed by a second adhesive disposed over the flexible wiring board.

9. The liquid ejecting head according to claim 1, wherein the flexible wiring board further includes
   a first portion that extends from the connection portion toward one side in the first direction, and
   a second portion that extends from the connection portion toward an opposite side away from the first portion in the first direction.

10. The liquid ejecting head according to claim 9, further comprising:
    a first integrated circuit mounted on the first portion; and
    a second integrated circuit mounted on the second portion; wherein
    the first portion and the second portion are bonded to the sealing plate by a first adhesive disposed in the opening, and
    the first integrated circuit, the second integrated circuit, and the first adhesive is sealed by a second adhesive disposed in the opening.

11. The liquid ejecting head according to claim 1, wherein the sealing plate is made of a monocrystalline silicon substrate.

12. The liquid ejecting head according to claim 11, wherein
    the monocrystalline silicon substrate has a first surface and a second surface that are opposite of each other in a thickness direction of the monocrystalline silicon substrate and is a preferential orientation substrate in which 50% or more of crystal in relation to a whole of crystal is oriented to the first surface.

13. The liquid ejecting head according to claim 1, wherein the flexible wiring board further includes
    a first portion that extends from the connection portion outward in the first direction, and
    as viewed in the second direction the first portion is inclined at an obtuse angle with respect to the connection portion.

14. A recording apparatus, comprising:
    the liquid ejecting head according to claim 1.

15. The liquid ejecting head according to claim 1, further comprising,
    a lead electrode electrically coupled to the piezoelectric actuator and the connection portion.

16. The liquid ejecting head according to claim 1, further comprising,
    a diaphragm disposed between the pressure compartment forming substrate and the piezoelectric actuator regarding the thickness direction of the sealing plate, wherein
    the connection portion is disposed on the diaphragm.

17. The liquid ejecting head according to claim 1,
    wherein the connection portion is disposed between the first surface and the pressure compartment forming substrate regarding the thickness direction of the sealing plate.

* * * * *